(12) United States Patent
Kim et al.

(10) Patent No.: US 9,124,224 B2
(45) Date of Patent: Sep. 1, 2015

(54) POWER GENERATING CIRCUIT AND SWITCHING CIRCUIT

(75) Inventors: Yu Sin Kim, Gyeonggi-do (KR); Dong Hyun Baek, Seoul (KR); Sun Woo Yun, Seoul (KR); Sung Hwan Park, Gyeonggi-do (KR)

(73) Assignees: SAMSUNG ELECTRO-MECHANICS CO., LTD., Gyunggi-Do (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 611 days.

(21) Appl. No.: 13/523,793

(22) Filed: Jun. 14, 2012

(65) Prior Publication Data
US 2012/0319773 A1    Dec. 20, 2012

(30) Foreign Application Priority Data

Jun. 16, 2011    (KR) .................. 10-2011-0058585

(51) Int. Cl.
*H03F 1/30*    (2006.01)
*H03K 17/80*    (2006.01)

(52) U.S. Cl.
CPC ....................... *H03F 1/30* (2013.01)

(58) Field of Classification Search
CPC ............................... H03K 17/80
USPC ....................................... 307/407
See application file for complete search history.

(56) References Cited

U.S. PATENT DOCUMENTS

| | | | |
|---|---|---|---|
| 6,097,221 A * | 8/2000 | Sako | 326/113 |
| 7,417,515 B2 | 8/2008 | Chominski | |
| 7,586,376 B2 | 9/2009 | Litmanen | |

FOREIGN PATENT DOCUMENTS

| | | |
|---|---|---|
| JP | 05-199099 A | 8/1993 |
| JP | 2008-042336 A | 2/2008 |
| KR | 10-1996-0002331 | 2/1996 |
| KR | 10-2000-0027846 A | 5/2000 |
| KR | 20-0222717 | 5/2001 |

OTHER PUBLICATIONS

KR 10-2012-0120340 Notice of Allowance dated Sep. 5, 2013.

* cited by examiner

*Primary Examiner* — Robert Deberadinis
(74) *Attorney, Agent, or Firm* — Bracewell & Giuliani LLP; Brad Y. Chin

(57) ABSTRACT

Disclosed herein is a power generating circuit including a first transistor in which a second control signal is applied to a control terminal and a first control signal is applied to one end, and which has the other end connected to an output terminal, a second transistor in which the first control signal is applied to a control terminal and the second control signal is applied to one end, and which has the other end connected to the output terminal a third transistor in which one of the first and the second control signals is applied to a control terminal and which has one end grounded, and a fourth transistor in which the other one thereof is applied to a control terminal and which has one end connected to the other end of the third transistor and the other end connected to the output terminal.

25 Claims, 4 Drawing Sheets

[FIG. 5]
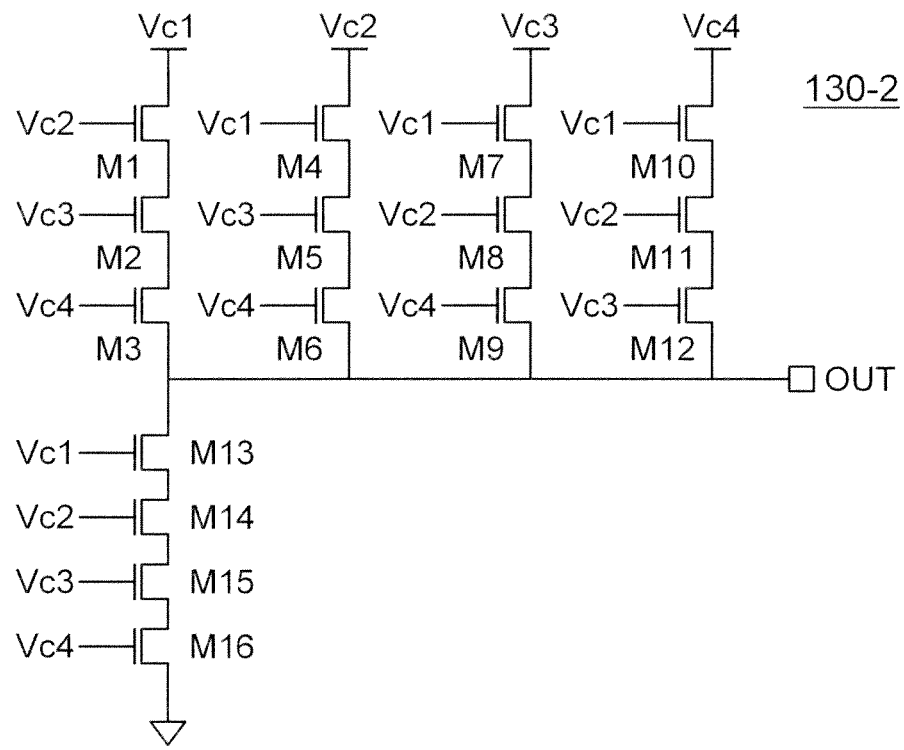
[FIG. 6]
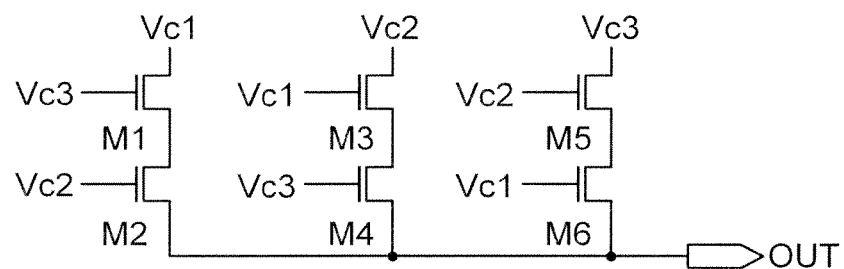

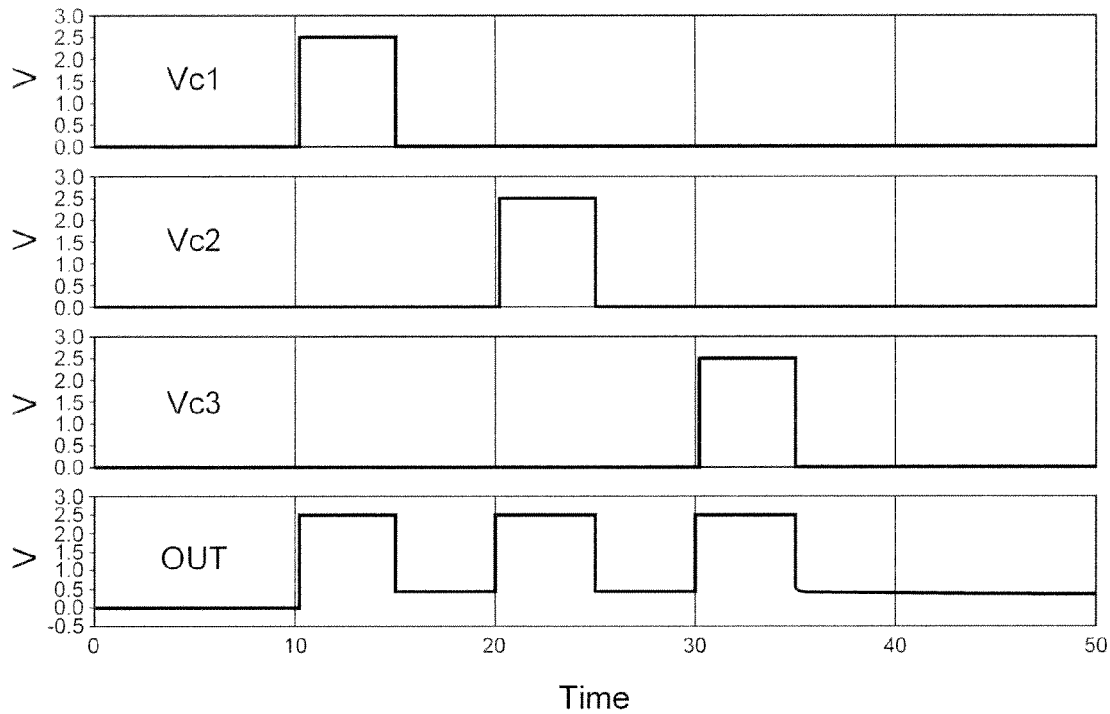
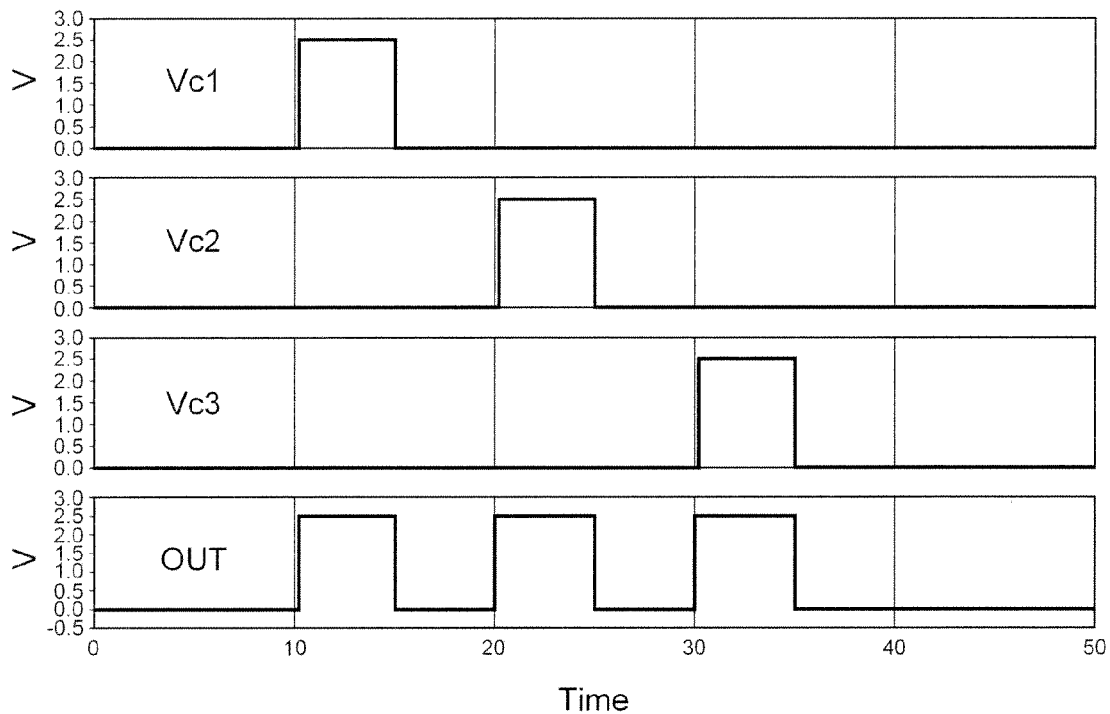

POWER GENERATING CIRCUIT AND SWITCHING CIRCUIT

CROSS REFERENCE(S) TO RELATED APPLICATIONS

This application claims the benefit under 35 U.S.C. Section 119 of Korean Patent Application Serial No. 10-2011-0058585, entitled "Power Generating Circuit and Switching Circuit" filed on Jun. 16, 2011, which is hereby incorporated by reference in its entirety into this application.

BACKGROUND OF THE INVENTION

1. Technical Field

The present invention relates to a power generating circuit and a switching circuit.

2. Description of the Related Art

In the recent electrical and electronic field, miniaturizing electronic devices and extending a battery life by reducing power consumption are much discussed issues.

Since even the parts that consume relatively less power should be supplied with power from a separate external power source, it is difficult to integrate closely related various parts on a chip. Also, since such parts require a separate pin to be supplied with power from a separate external power source, miniaturization is limited.

FIG. 1 is a schematic view illustrating a related-art switching circuit.

Referring to FIG. 1, a related-art switching circuit is operated as a power amplifier and a switch unit, which receives a control signal from a controller such as a chipset, are supplied with power from the same power source (Vs).

However, if the power amplifier and the switch unit are supplied with power from the same power source (Vs) as shown in FIG. 1, a mutual interference phenomenon may occur between a noise of the power amplifier and a noise of the switch unit, causing performance deterioration of each element.

Also, if the switch unit is operated by an external power source, power is continuously supplied regardless of whether the control signal applied to the switch unit is on or off or high or low and thus unnecessary power consumption may be incurred.

SUMMARY OF THE INVENTION

An object of the present invention is to provide a power generating circuit, which receives a control signal and generates power.

Also, an object of the present invention is to provide a switching circuit having the above power generating circuit.

According to an exemplary embodiment of the present invention, there is provided a power generating circuit including: a first transistor in which a second control signal is applied to a control terminal and a first control signal is applied to one end, and which has the other end connected to an output terminal, a second transistor in which the first control signal is applied to a control terminal and the second control signal is applied to one end, and which has the other end connected to the output terminal, a third transistor in which one of the first and the second control signals is applied to a control terminal and which has one end grounded, and a fourth transistor in which the other one of the first and the second control signals is applied to a control terminal and which has one end connected to the other end of the third transistor and the other end connected to the output terminal.

If the first control signal or the second control signal is an on-signal, a power voltage may be output from the output terminal.

Only if the first control signal or the second control signal is an on-signal, a power voltage may be output from the output terminal, and if the first control signal and the second control signal are off-signals, a 0 voltage may be output from the output terminal.

The first transistor, the second transistor, the third transistor, and the fourth transistor may be P-type or N-type metal-oxide semiconductor (MOS) transistors.

According to another exemplary embodiment of the present invention, there is provided a power generating circuit including: a first transistor in which a third control signal is applied to a control terminal and a first control signal is applied to one end, a second transistor in which a second control signal is applied to a control terminal, and which has one end connected to the other end of the first transistor and the other end connected to an output terminal, a third transistor in which the first control signal is applied to a control terminal and the second control signal is applied to one end, a fourth transistor in which the third control signal is applied to a control terminal, and which has one end connected to the other end of the third transistor and the other end connected to the output terminal, a fifth transistor in which the second control signal is applied to a control terminal and the third control signal is applied to one end, a sixth transistor in which the first control signal is applied to a control terminal, and which has one end connected to the other end of the fifth transistor and the other end connected to the output terminal, a seventh transistor in which one of the first, the second, and the third control signals is applied to a control terminal, and which has one end grounded, an eighth transistor in which one of the control signals except for the control signal applied to the control terminal of the seventh transistor is applied to a control terminal, and which has one end connected to the other end of the seventh transistor, and a ninth transistor in which the control signal except for the control signal applied to the control terminal of the seventh transistor and the control signal applied to the control terminal of the eighth transistor is applied to a control terminal, and which has one end connected to the other end of the eighth transistor and the other end connected to the output terminal.

If either one of the first control signal, the second control signal, and the third control signal is an on-signal, a power voltage may be output from the output terminal.

Only if one of the first control signal, the second control signal, and the third control signal is an on-signal, a power voltage may be output from the output terminal, and if the first control signal, the second control signal, and the third control signal are off-signals, a 0 voltage may be output from the output terminal.

The first transistor to the ninth transistor may be P-type or N-type MOS transistors.

According to still another exemplary embodiment of the present invention, there is provided a power generating circuit including: two transistors in which one of two control signals is applied to one end of each transistor and the other one of the two control signals is applied to a control terminal of each transistor, and which each has the other end connected to an output terminal, a ground transistor in which one of the control signals is applied to a control terminal, and which has one end grounded, and a connection transistor in which the other one of the control signals is applied to a control terminal, and which has one end connected to the other end of the ground transistor and the other end connected to the output terminal.

Different control signals may be applied to the control terminals of the two transistors.

If one of the two control signals is an on-signal, a power voltage may be output from the output terminal.

Only if one of the two control signals is an on-signal, a power voltage may be output from the output terminal, and if all of the two control signals are off-signals, a 0 voltage may be output from the output terminal.

According to still another exemplary embodiment of the present invention, there is provided a power generating circuit including: two MOS transistors in which one of two control signals is applied to a source of each MOS transistor and the other one of the two control signals is applied to a gate of each MOS transistor, and each has a drain connected to an output terminal, a ground transistor in which one of the two control signal is applied to a gate and which has a source grounded, and a connection transistor in which the other one of the two control signals is applied to a gate, and which has a source connected to a drain of the ground transistor and a drain connected to the output terminal.

Different control signals may be applied to the control terminals of the two transistors.

If one of the two control signals is an on-signal, a power voltage may be output from the output terminal.

Only if one of the two control signals is an on-signal, a power voltage may be output from the output terminal, and if all of the two control signals are off-signals, a 0 voltage may be output from the output terminal.

The MOS transistors may be P-type or N-type MOS transistors. The ground transistor and the connection transistor may be P-type or N-type MOS transistors.

According to still another exemplary embodiment of the present invention, there is provided a power generating circuit including: a first transistor in which a second control signal is applied to a control terminal and a first control signal is applied to one end, a second transistor in which a third control signal is applied to a control terminal and which has one end connected to the other end of the first transistor, a third transistor in which a fourth control signal is applied to a control terminal, and which has one end connected to the other end of the second transistor and the other end connected to an output terminal, a fourth transistor in which the first control signal is applied to a control terminal and the second control signal is applied to one end, a fifth transistor in which the third control signal is applied to a control terminal and which has one end connected to the other end of the fourth transistor, a sixth transistor in which the fourth control signal is applied to a control terminal, and which has one end connected to the other end of the fifth transistor and the other end connected to the output terminal, a seventh transistor in which the first control signal is applied to a control terminal and the third control signal is applied to one end, an eighth transistor in which the second control signal is applied to a control terminal and which has one end connected to the other end of the seventh transistor, a ninth transistor in which the fourth control signal is applied to a control terminal, and which has one end connected to the other end of the eighth transistor and the other end connected to the output terminal, a tenth transistor in which the first control signal is applied to a control terminal and the fourth control signal is applied to one end, an eleventh transistor in which the second control signal is applied to a control terminal and has one end connected to the other end of the tenth transistor, a twelfth transistor in which the third control signal is applied to a control terminal, and which has one end connected to the other end of the eleventh transistor and the other end connected to the output terminal, a thirteenth transistor in which one of the first to the fourth control signals is applied to a control terminal and which has one end grounded, a fourteenth transistor in which one of the control signals except for the control signal applied to the control terminal of the thirteenth transistor is applied to a control terminal, and which has one end connected to the other end of the thirteenth transistor, a fifteenth transistor in which one of the control signals except for the control signal applied to the control terminal of the thirteenth transistor and the control signal applied to the control terminal of the fourteenth transistor is applied to a control terminal, and which has one end connected to the other end of the fourteenth transistor, and a sixteenth transistor in which the control signal except for the control signals applied to the control terminals of the thirteenth transistor to the fifteenth transistor is applied to a control terminal, and which has one end connected to the other end of the fifteenth transistor and the other end connected to the output terminal.

If one of the first control signal, the second control signal, the third control signal, and the fourth control signal is an on-signal, a power voltage may be output from the output terminal.

Only if one of the first control signal, the second control signal, the third control signal, and the fourth control signal is an on-signal, a power voltage may be output from the output terminal, and if the first control signal, the second control signal, the third control signal, and the fourth control signal are off-signals, a 0 voltage may be output from the output terminal.

The first transistor to the sixteenth transistor may be P-type or N-type MOS transistors.

According to still another exemplary embodiment of the present invention, there is provided a switching circuit, including: a power generating circuit as described above, a switch unit which is switched on/off according to a control signal, and a power amplifier which receives the control signal.

The switching circuit may further include a power source unit, which supplies power to the power amplifier.

The switching circuit may further include a power source unit, which supplies power to the power amplifier, and the switch unit may be supplied with power generated in the power generating circuit.

BRIEF DESCRIPTION OF THE DRAWINGS

FIG. 5 is a schematic circuit diagram of a power generating circuit according to a third exemplary embodiment;

FIG. 6 is a schematic circuit diagram of a modified example of FIG. 4;

FIG. 7 is a view of signals of input and output terminals of the power generating circuit of FIG. 6; and FIG. 8 is a view of signals of input and output terminals of the power generating circuit of FIG. 4.

DESCRIPTION OF THE PREFERRED EMBODIMENTS

Figure 1:
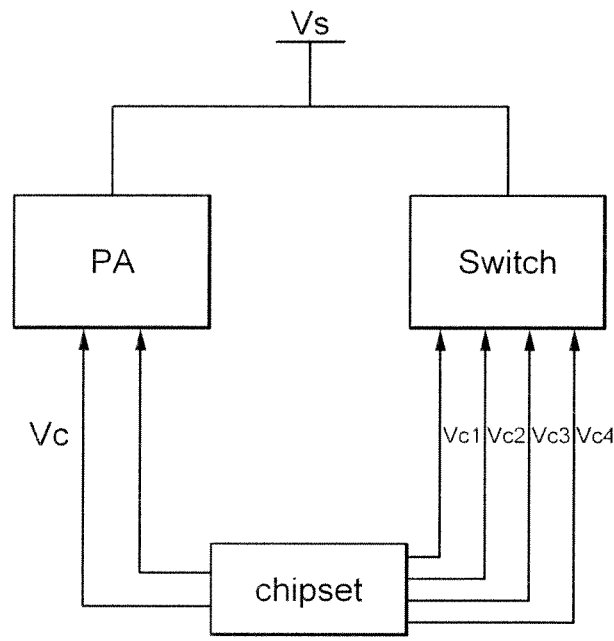
FIG. 1 is a schematic view of a related-art switching circuit.

The advantages and the features of the present invention, and technology to achieve these will be apparent by referring to exemplary embodiments described in detail below with reference to the accompanying drawings. However, the present invention should not be limited to the exemplary embodiments described below and may be embodied in various different forms. The exemplary embodiments are provided to complete the disclosure of the present invention and also to inform those skilled in the art of the scope of the present invention. In the following description, same reference numerals are used for the same elements.

The terms and words used in the present specification and claims should not be interpreted as being limited to typical meanings or dictionary definitions. In the following description, the singular expression is intended to include the plural expression unless the context clearly indicates otherwise. The terms 'comprises' and/or 'comprising' used in the specification and claims do not preclude the presence or addition of one or more other components, steps, and/or elements.

Hereinafter, the present invention will be explained in detail with reference to the accompanying drawings.

Figure 2:
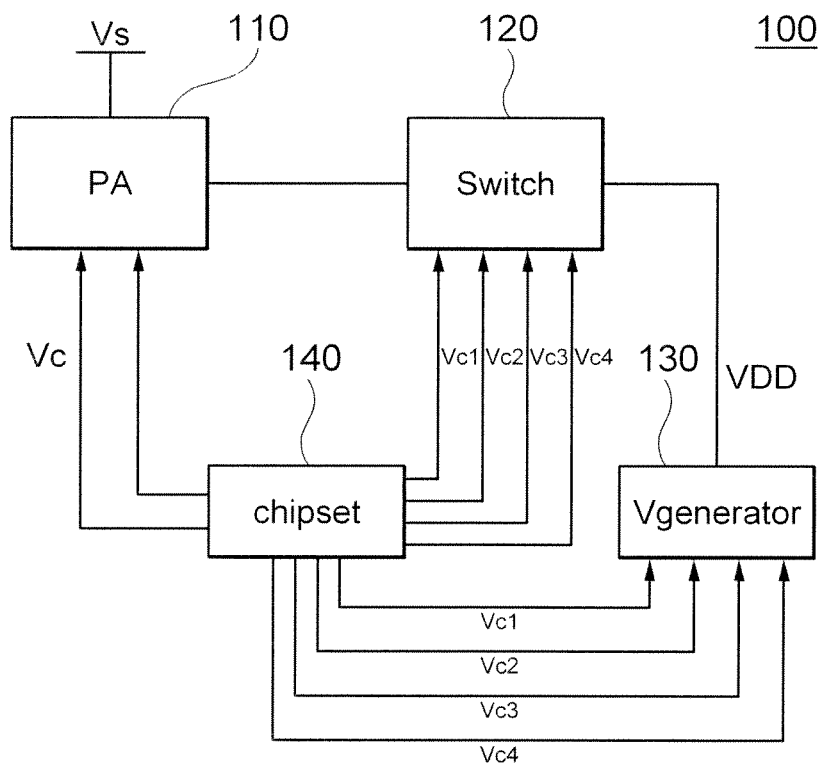
FIG. 2 is a schematic view of a switching circuit according to an exemplary embodiment.

FIG. 2 is a schematic view of a switching circuit according to an exemplary embodiment.

Referring to FIG. 2, a switching circuit 100 according to an exemplary embodiment includes a power amplifier 110, a switch unit 120, and a power generating circuit 130.

The power generating circuit 130 receives control signals generated by a controller 140, which may be realized as a variety of chipsets, and generates a power voltage (VDD) to be supplied by the switch unit 120.

The power amplifier 110 may be supplied with power from a separate external power source (Vs), and the switch unit 120 may be supplied with power from the power generating circuit 130.

Accordingly, since the switch unit 120 can be driven by receiving the power generated in the power generating circuit 130 without a separate external power source, an entire size of the switching circuit 100 can be reduced.

Also, the since the power amplifier 110 and the switch unit 120 are driven by separate power sources, a noise interference phenomenon between the power amplifier 110 and the switch unit 120 can be minimized and reliability of the switching circuit can be improved.

Figure 3:
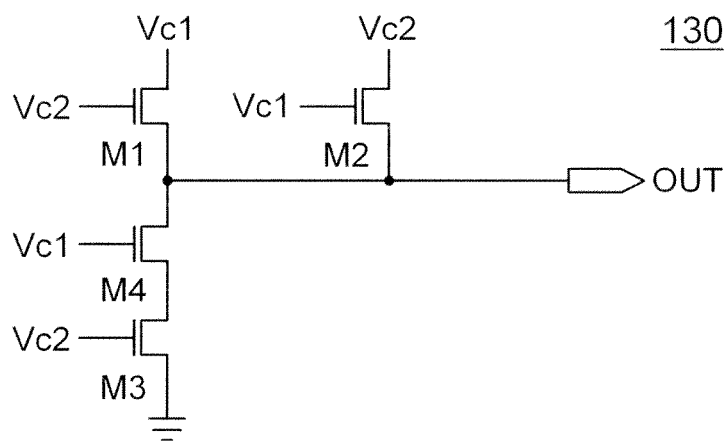
FIG. 3 is a schematic circuit diagram of a power generating circuit according to a first exemplary embodiment.

FIG. 3 is a view of a power generating circuit 130 according to a first exemplary embodiment.

Referring to FIG. 3, a power generating circuit 130 according to a first exemplary embodiment includes two transistors, a grounded transistor, a connection transistor, and an output terminal.

Each of the two transistors includes a control terminal and two terminals. Different control signals may be applied to the control signal and one of the two terminals.

In each transistor, one of two control signals is applied to one end and the other control signal is applied to the control terminal, and the other end of the transistor is connected to the output terminal.

In the grounded transistor, one of the control signals is applied to a control terminal, and one end is grounded.

In the connection transistor, the other one of the control signals is applied to a control terminal, and one end of the connection transistor is connected to the other end of the ground transistor and the other end is connected to the output terminal.

The two transistors, the ground transistor and the connection transistor may be realized as metal-oxide semiconductor (MOS) transistors.

The MOS transistors may be a P-type or N-type transistor. In FIG. 3, the two transistors may be expressed by transistors N1 and M2, the ground transistor may be expressed by a transistor M3, and the connection transistor may be expressed by a transistor M4.

Referring to FIG. 3, the power generating circuit 130 according to the first exemplary embodiment includes the first MOS transistor M1 to the fourth MOS transistor M4.

In the first MOS transistor M1, a second control signal is applied to a gate, a first control signal is applied to a source, and a drain is connected to the output terminal. In the second MOS transistor M2, the first control signal is applied to a gate, the second control signal is applied to a source, and a drain is connected to the output terminal.

Also, in the third MOS transistor M3, the second control signal is applied to a gate and a source is grounded. In the fourth MOS transistor M4, the first control signal is applied to a gate, a source is connected to a drain of the third MOS transistor M3, and a drain is connected to the output terminal.

Although not shown, the first control signal may be applied to the gate of the third MOS transistor M3 and the first control signal may be applied to the gate of the fourth MOS transistor M4.

Also, if the first control signal or the second control signal is an on-signal, a power voltage may be output from the output terminal.

Also, only if the first control signal or the second control signal is an on-signal, the output terminals output the power voltage, and if the first control signal and the second control signal are off-signals, the output terminal outputs a 0 voltage.

The first MOS transistor, the second MOS transistor, the third MOS transistor, and the fourth MOS transistor may be P-type or N-type MOS transistors.

TABLE 1

| Vc1 | Vc2 | OUT |
|-----|-----|-----|
| H   | L   | H   |
| L   | H   | H   |
| L   | L   | 0   |

As illustrated in Table 1 above, the first control signal (Vc1) and the second control signal (Vc2) may be H or L. Hereinafter, a principle of generating a power voltage in the power generating circuit 130 in each case according to the first exemplary embodiment will be explained.

First, referring to FIG. 3, if Vc1 is H and Vc2 is L, the first MOS transistor M1 may be in an on-state and the output terminal (OUT) may output H.

If Vc1 is L and Vc2 is H, the second MOS transistor M2 may be in an on-state and the output terminal (OUT) may output H.

However, if Vc1 and Vc2 are all L, the first MOS transistor M1 and the second MOS transistor M2 are all in an off-state and the output terminal (CUT) outputs L.

If Vc1 and Vc2 are L and L, the third MOS transistor M3 and the fourth MOS transistor M4 conduct electricity and the output terminal is grounded, and, if either one of Vc1 and Vc2 is H, the output terminal is not grounded.

Accordingly, the output terminal outputs H or is grounded to output a 0 voltage.

It is normal that a general transistor leaks a minute current even when being in an off-state. Accordingly, even though all control signals are L, a power generating circuit illustrated in FIG. 6 leaks a minute current through the output terminal, causing a malfunction.

However, if the third MOS transistor and the fourth MOS transistor are provided as shown in FIG. 3, a minute current remaining in the power generating circuit 130 is swiftly removed using the grounded terminal, when all of the controls signals are changed to L in a state where one control signal is H, and thus the output terminal outputs only H or 0.

For easy understanding, FIGS. 7 and 8 illustrate examples of signals of input and output terminals of the power generating circuits. FIG. 7 illustrates an example of signals of input and output terminals of the power generating circuit of FIG. 6, and FIG. 8 illustrates an example of signals of input and output terminals of a power generating circuit of FIG. 4.

Comparing the power generating circuits of FIGS. 7 and 8, Vout of FIG. 7 is not completely 0 if Vc1, Vc2, and Vc3 are L, L, and L, but Vout of FIG. 8 is completely 0 if Vc1, Vc2, and Vc3 are L, L, and L.

Figure 4:
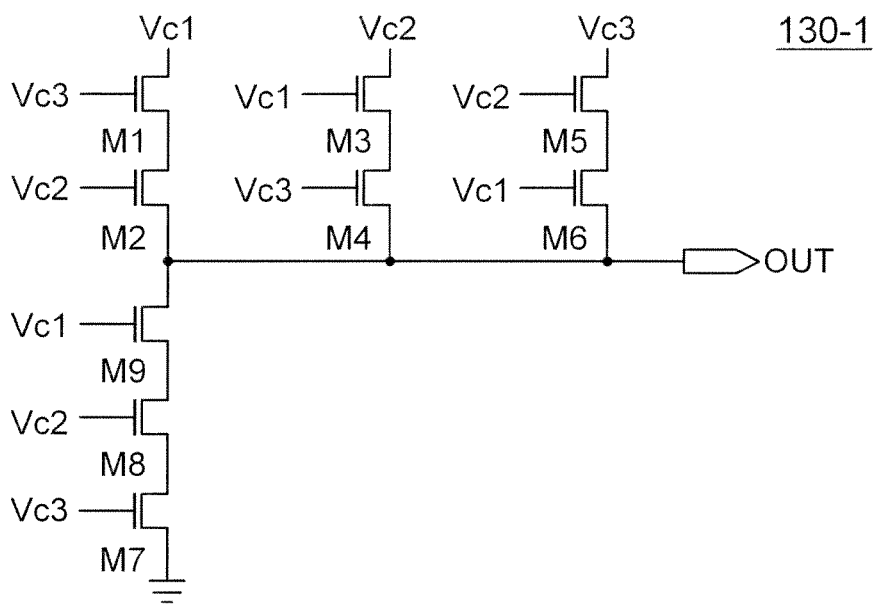
FIG. 4 is a schematic circuit diagram of a power generating circuit according to a second exemplary embodiment.

FIG. 4 is a view of a power generating circuit 130-1 according to a second exemplary embodiment, which is applied if three control signals are applied.

Referring to FIG. 4, the power generating circuit 130-1 according to the second exemplary embodiment may include a first MOS transistor M1 to a ninth MOS transistor M9.

In the first MOS transistor M1, a third control signal is applied to a gate and a first control signal is applied to a source. In the second MOS transistor M2, a second control signal is applied to a gate, a source is connected to a drain of the first MOS transistor M1, and a drain is connected to an output terminal.

Also, in the third MOS transistor M3, the first control signal is applied to a gate and the second control signal is applied to the source. In the fourth MOS transistor M4, the third control signal is applied to a gate, a source is connected to a drain of the third MOS transistor M3, and a drain is connected to the output terminal.

Also, in the fifth MOS transistor M5, the second control signal is applied to a gate and the third control signal is applied to a source. In the sixth MOS transistor M6, the first control signal is applied to a gate, a source is connected to a drain of the fifth MOS transistor M5, and a drain is connected to the output terminal.

Also, in the seventh MOS transistor M7, the third control signal is applied to a gate and a source is grounded. In the eighth MOS transistor M8, the second control signal is applied to a gate and a source is connected to a drain of the seventh MOS transistor M7. In the ninth MOS transistor M9, the first control signal is applied to a gate, a source is connected to a drain of the eighth MOS transistor M8, and a drain is connected to the output terminal.

Although not shown, the first control signal, the second control signal, and the third control signal may be applied to the gates of the seventh MOS transistor M7 to the ninth MOS transistor M9 one by one in different order.

If one of the first control signal, the second control signal, and the third control signal is an on-signal, a power voltage may be output from the output terminal.

Also, only if the first control signal, the second control signal, and the third control signal are on-signals, the output terminals outputs the power voltage, and if the first control signal, the second control signal, and the third control signal are off-signals, the output terminal outputs a 0 voltage.

The first MOS transistor M1 through the ninth MOS transistor M9 may be P-type or N-type MOS transistors.

TABLE 2

| Vc1 | Vc2 | Vc3 | OUT |
|-----|-----|-----|-----|
| H   | L   | L   | H   |
| L   | H   | L   | H   |

TABLE 2-continued

| Vc1 | Vc2 | Vc3 | OUT |
|-----|-----|-----|-----|
| L   | L   | H   | H   |
| L   | L   | L   | 0   |

As shown in Table 2 above, the first control signal (Vc1), the second control signal (Vc2), and the third control signal (Vc3) may be H or L. Hereinafter, a principle of generating a power voltage in the power generating circuit 130-1 in each case according to the second exemplary embodiment will be explained.

First, referring to FIG. 4, if Vc1 is H, Vc2 is L, and Vc3 is L, the first MOS transistor M1 and the second MOS transistor M2 are in an on-state and the output terminal (OUT) outputs H.

If Vc1 is L, Vc2 is H, and Vc3 is L, the third MOS transistor M3 and the fourth MOS transistor M4 are in an on-state and the output terminal (OUT) outputs H.

If Vc1 is L, Vc2 is L, and Vc3 is H, the fifth MOS transistor M5 and the sixth MOS transistor M6 are in an on-state and the output terminal (OUT) outputs H.

However, if Vc1, Vc2, and Vc3 are all L, the first MOS transistor M1 to the sixth MOS transistor M6 are all in an off-state and the output terminal (OUT) outputs L.

If Vc1, Vc2, and Vc3 are L, L, and L, the seventh MOS transistor M7 to the ninth MOS transistor M9 conduct electricity and the output terminal (OUT) is grounded, and if either one of Vc1, Vc2, and Vc3 is H, the output terminal is not grounded.

Accordingly, the output terminal outputs H or is grounded to output a 0 voltage.

It is normal that a general transistor leaks a minute current even when being in an off-state. Accordingly, even though all control signals are L, the power generating circuit illustrated in FIG. 6 leaks a minute current through the output terminal, causing a malfunction.

However, if the seventh MOS transistor to the ninth MOS transistor are provided as shown in FIG. 4, a minute current remaining in the power generating circuit 130-1 is swiftly removed using the grounded terminal, when all of the controls signals are changed to L in a state where one control signal is H, and thus the output terminal outputs only H or 0.

For easy understanding, FIGS. 7 and 8 illustrate examples of signals of input and output terminals of the power generating circuits. FIG. 7 illustrates an example of signals of input and output terminals of the power generating circuit of FIG. 6, and FIG. 8 illustrates an example of signals of input and output terminals of a power generating circuit of FIG. 4.

Comparing the power generating circuits of FIGS. 7 and 8, Vout of FIG. 7 is not completely 0 if Vc1, Vc2, and Vc3 are L, L, and L, but Vout of FIG. 8 is completely 0 if Vc1, Vc2, and Vc3 are L, L, and L.

FIG. 5 is a view of a power generating circuit 130-2 according to a third exemplary embodiment, which is applied if four control signals are applied.

Referring to FIG. 5, the power generating circuit 130-2 according to the third exemplary embodiment includes a first MOS transistor M1 to a sixteenth MOS transistor M16.

In the first MOS transistor M1, a second control signal is applied to a gate and a first control signal is applied to a source. In the second MOS transistor M2, a third control signal is applied to a gate and a source is connected to a drain of the first MOS transistor M1. In the third MOS transistor M3, a fourth control signal is applied to a gate, a source is connected to a drain of the second MOS transistor M2, and a drain is connected to an output terminal.

In the fourth MOS transistor M4, the first control signal is applied to a gate and the second control signal is applied to a source. In the fifth MOS transistor M5, the third control signal is applied to a gate and a source is connected to a drain of the fourth MOS transistor M4. In the sixth MOS transistor M6, the fourth control signal is applied to a gate, a source is connected to a drain of the fifth MOS transistor M5, and a drain is connected to the output terminal.

Also, in the seventh MOS transistor M7, the first control signal is applied to a gate and the third control signal is applied to a source. In the eighth MOS transistor M8, the second control signal is applied to a gate and a source is connected to a drain of the seventh MOS transistor M7. In the ninth MOS transistor M9, the fourth control signal is applied to a gate, a source is connected to a drain of the eighth MOS transistor M8, and a drain is connected to the output terminal.

Also, in the tenth MOS transistor M10, the first control signal is applied to a gate and the fourth control signal is applied to a source. In the eleventh MOS transistor M11, the second control signal is applied to a gate and a source is connected to a drain of the tenth MOS transistor M10. In the twelfth MOS transistor M12, the third control signal is applied to a gate, a source is connected to a drain of the eleventh MOS transistor M11, and a drain is connected to the output terminal.

Also, in the thirteenth MOS transistor M13, the fourth control signal is applied to a gate and a source is grounded. In the fourteenth MOS transistor M14, the third control signal is applied to a gate and a source is connected to a drain of the thirteen MOS transistor M13. In the fifteenth MOS transistor M15, the second control signal is applied to a gate and a source is connected to a drain of the fourteenth MOS transistor M14. In the sixteenth MOS transistor M16, the first control signal is applied to a gate, a source is connected to a drain of the fifteenth MOS transistor M15, and a drain is connected to the output terminal.

Although not shown, the first control signal, the second control signal, the third control signal, and the fourth control signal may be applied to the gates of the thirteenth MOS transistor M13 to the sixteenth MOS transistor M16 one by one in different order.

If either one of the first control signal, the second control signal, the third control signal, and the fourth control signal is an on-signal, a power voltage may be output from the output terminals.

Also, only if the first control signal, the second control signal, the third control signal, and the fourth control signal are on-signals, the output terminal outputs the power voltage, and if the first control signal, the second control signal, the third control signal, and the fourth control signal are off-signals, the output terminal outputs a 0 voltage.

Also, the first MOS transistor M1 to the sixteenth MOS transistor M16 are P-type or N-type MOS transistors.

TABLE 3

| Vc1 | Vc2 | Vc3 | Vc4 | OUT |
|---|---|---|---|---|
| H | L | L | L | H |
| L | H | L | L | H |
| L | L | H | L | H |
| L | L | L | H | H |
| L | L | L | L | 0 |

As shown in Table 3 above, the first control signal (Vc1), the second control signal (Vc2), the third control signal (Vc3), and the fourth control signal (Vc4) may be H or L. Hereinafter, a principle of generating a power voltage in the power generating circuit 130-2 in each case according to the third exemplary embodiment will be explained.

First, referring to FIG. 5, if Vc1 is H and Vc2 to Vc4 are L, the first MOS transistor M1, the second MOS transistor M2, and the third MOS transistor M3 are in an on-state and the output terminal (OUT) outputs H.

If Vc1 is L, Vc2 is H, Vc3 is L, and Vc4 is L, the fourth MOS transistor M4, the fifth MOS transistor M5, and the sixth MOS transistor M6 are in an on-state and the output terminal (OUT) outputs H.

Also, if Vc1 is L, Vc2 is L, Vc3 is H, and Vc4 is L, the seventh MOS transistor M7, the eighth MOS transistor M8, and the ninth MOS transistor M9 are in an on-state and the output terminal (OUT) outputs H.

Also, if Vc1 is L, Vc2 is L, Vc3 is L, and Vc4 is H, the tenth MOS transistor M10, the eleventh MOS transistor M11, and the twelfth MOS transistor M12 are in an on-state and the output terminal (OUT) outputs H.

However, if Vc1, Vc2, Vc3, and Vc4 are all L, the first MOS transistor M1 to the twelfth MOS transistor M12 are all in an off-state and the output terminal (OUT) outputs L.

Also, if Vc1, Vc2, Vc3, and Vc4 are L, L, L, and L, the thirteenth MOS transistor M13 to the sixteenth MOS transistor M16 conduct electricity and the output terminal (OUT) is grounded. If either one of Vc1, Vc2, Vc3, and Vc4 is H, the output terminal is not grounded.

Accordingly, the output terminal outputs H or is grounded to output a 0 voltage.

It is normal that a general transistor leaks a minute current even when being in an off-state. Accordingly, even though all control signals are L, the power generating circuit illustrated in FIG. 6 leaks a minute current through the output terminal, causing a malfunction or incurring unnecessary power consumption.

However, if the thirteenth MOS transistor to the sixteenth MOS transistor are provided as shown in FIG. 5, a minute current remaining in the power generating circuit 130-2 is swiftly removed using the grounded terminal, when all of the controls signals are changed to L in a state where one control signal is H, and thus the output terminal outputs only H or 0.

For easy understanding, FIGS. 7 and 8 illustrate examples of signals of input and output terminals of the power generating circuits. FIG. 7 illustrates an example of signals of input and output terminals of the power generating circuit of FIG. 6, and FIG. 8 illustrates an example of signals of input and output terminals of the power generating circuit of FIG. 4.

Comparing the power generating circuits of FIGS. 7 and 8, Vout of FIG. 7 is not completely 0 if Vc1, Vc2, and Vc3 are L, L, and L, but Vout of FIG. 8 is completely 0 if Vc1, Vc2, and Vc3 are L, L, and L. The power consumption can be reduced more than in a case that the output terminal continuously outputs H by the external power source.

Since the power generating circuit described above generates power with only the control signal, it is possible to miniaturize various electronic devices.

Also, since the power is generated only if a control signal corresponding to on or high is applied, power consumption can be reduced more than in a case that external power is continuously supplied as in the related art.

Also, the switching circuit having the power generating circuit of the present invention can be made smaller than a related-art switching circuit and the mutual interference phenomenon between the noise of the power amplifier and the noise of the switch unit can be minimized even if the power amplifier and the switching unit are integrated on a chip. Therefore, performance deterioration of each element can be minimized.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A power generating circuit comprising:
 a first transistor in which a second control signal is applied to a control terminal and a first control signal is applied to one end, and which has the other end connected to an output terminal;
 a second transistor in which the first control signal is applied to a control terminal and the second control signal is applied to one end, and which has the other end connected to the output terminal;
 a third transistor in which one of the first and the second control signals is applied to a control terminal and which has one end grounded; and
 a fourth transistor in which the other one of the first and the second control signals is applied to a control terminal and which has one end connected to the other end of the third transistor and the other end connected to the output terminal.

2. The power generating circuit according to claim 1, wherein, if the first control signal or the second control signal is an on-signal, a power voltage is output from the output terminal.

3. The power generating circuit according to claim 1, wherein, only if the first control signal or the second control signal is an on-signal, a power voltage is output from the output terminal, and if the first control signal and the second control signal are off-signals, a 0 voltage is output from the output terminal.

4. The power generating circuit according to claim 1, wherein the first transistor, the second transistor, the third transistor, and the fourth transistor are P-type or N-type metal-oxide semiconductor (MOS) transistors.

5. A power generating circuit comprising:
 a first transistor in which a third control signal is applied to a control terminal and a first control signal is applied to one end;
 a second transistor in which a second control signal is applied to a control terminal, and which has one end connected to the other end of the first transistor and the other end connected to an output terminal;
 a third transistor in which the first control signal is applied to a control terminal and the second control signal is applied to one end;
 a fourth transistor in which the third control signal is applied to a control terminal, and which has one end connected to the other end of the third transistor and the other end connected to the output terminal;
 a fifth transistor in which the second control signal is applied to a control terminal and the third control signal is applied to one end;
 a sixth transistor in which the first control signal is applied to a control terminal, and which has one end connected to the other end of the fifth transistor and the other end connected to the output terminal;
 a seventh transistor in which one of the first, the second, and the third control signals is applied to a control terminal, and which has one end grounded;
 an eighth transistor in which one of the control signals except for the control signal applied to the control terminal of the seventh transistor is applied to a control terminal, and which has one end connected to the other end of the seventh transistor; and
 a ninth transistor in which the control signal except for the control signal applied to the control terminal of the seventh transistor and the control signal applied to the control terminal of the eighth transistor is applied to a control terminal, and which has one end connected to the other end of the eighth transistor and the other end connected to the output terminal.

6. The power generating circuit according to claim 5, wherein, if either one of the first control signal, the second control signal, and the third control signal is an on-signal, a power voltage is output from the output terminal.

7. The power generating circuit according to claim 5, wherein, only if one of the first control signal, the second control signal, and the third control signal is an on-signal, a power voltage is output from the output terminal, and if the first control signal, the second control signal, and the third control signal are off-signals, a 0 voltage is output from the output terminal.

8. The power generating circuit according to claim 5, wherein the first transistor to the ninth transistor are P-type or N-type MOS transistors.

9. A power generating circuit comprising:
 two transistors in which one of two control signals is applied to one end of each transistor and the other one of the two control signals is applied to a control terminal of each transistor, and which each has the other end connected to an output terminal;
 a ground transistor in which one of the control signals is applied to a control terminal, and which has one end grounded;
 a connection transistor in which the other one of the control signals is applied to a control terminal, and which has one end connected to the other end of the ground transistor and the other end connected to the output terminal; and
 a control signal applied to one end of one of the two transistors and a control signal applied to the control terminal of the other one of the two transistors are same each other, and a control signal applied to the control terminal of one of the two transistors and a control signal applied to one end of the other one of the two transistors are equal to each other.

10. The power generating circuit according to claim 9, wherein different control signals are applied to the control terminals of the two transistors.

11. The power generating circuit according to claim 9, wherein, if one of the two control signals is an on-signal, a power voltage is output from the output terminal.

12. The power generating circuit according, to claim 9, wherein, only if one of the two control signals is an on-signal, a power voltage is output from the output terminal, and if all of the two control signals are off-signals, a 0 voltage is output from the output terminal.

13. A power generating circuit comprising:
two MOS transistors in which one of two control signals is applied to a source of each MOS transistor and the other one of the two control signals is applied to a gate of each MOS transistor, and which each has a drain connected to an output terminal;
a ground transistor in which one of the two control signal is applied to a gate and which has a source grounded;
a connection transistor in which the other one of the two control signals is applied to a gate, and which has a source connected to a drain of the ground transistor and a drain connected to the output terminal; and
a control signal applied to the source of one of the two MOS transistors and a control signal applied to the gate of the other one of the two MOS transistors are same each other, and a control signal applied to the gate of one of the two MOS transistors and a control signal applied to the source of the other one of the two MOS transistors are equal to each other.

14. The power generating circuit according to claim 13, wherein different control signals are applied to the control terminals of the two transistors.

15. The power generating circuit according to claim 13, wherein, if one of the two control signals is an on-signal, a power voltage is output from the output terminal.

16. The power generating circuit according to claim 13, wherein, only if one of the two control signals is an on-signal, a power voltage is output from the output terminal, and if all of the two control signals are off-signals, a 0 voltage is output from the output terminal outputs.

17. The power generating circuit according to claim 13, wherein the MOS transistors are P-type or N-type MOS transistors.

18. The power generating circuit according to claim 13, wherein the ground transistor and the connection transistor are P-type or N-type MOS transistors.

19. A power generating circuit comprising:
a first transistor in which a second control signal is applied to a control terminal and a first control signal is applied to one end;
a second transistor in which a third control signal is applied to a control terminal and which has one end connected to the other end of the first transistor;
a third transistor in which a fourth control signal is applied to a control terminal, and which has one end connected to the other end of the second transistor and the other end connected to an output terminal;
a fourth transistor in which the first control signal is applied to a control terminal and the second control signal is applied to one end;
a fifth transistor in which the third control signal is applied to a control terminal and which has one end connected to the other end of the fourth transistor;
a sixth transistor in which the fourth control signal is applied to a control terminal, and which has one end connected to the other end of the fifth transistor and the other end connected to the output terminal;
a seventh transistor in which the first control signal is applied to a control terminal and the third control signal is applied to one end;
an eighth transistor in which the second control signal is applied to a control terminal and which has one end connected to the other end of the seventh transistor;
a ninth transistor in which the fourth control signal is applied to a control terminal, and which has one end connected to the other end of the eighth transistor and the other end connected to the output terminal;
a tenth transistor in which the first control signal is applied to a control terminal and the fourth control signal is applied to one end;
an eleventh transistor in which the second control signal is applied to a control terminal and has one end connected to the other end of the tenth transistor;
a twelfth transistor in which the third control signal is applied to a control terminal, and which has one end connected to the other end of the eleventh transistor and the other end connected to the output terminal;
a thirteenth transistor in which one of the first to the fourth control signals is applied to a control terminal and which has one end grounded;
a fourteenth transistor in which one of the control signals except for the control signal applied to the control terminal of the thirteenth transistor is applied to a control terminal, and which has one end connected to the other end of the thirteenth transistor;
a fifteenth transistor in which one of the control signals except for the control signal applied to the control terminal of the thirteenth transistor and the control signal applied to the control terminal of the fourteenth transistor is applied to a control terminal, and which has one end connected to the other end of the fourteenth transistor; and
a sixteenth transistor in which the control signal except for the control signals applied to the control terminals of the thirteenth transistor to the fifteenth transistor is applied to a control terminal, and which has one end connected to the other end of the fifteenth transistor and the other end connected to the output terminal.

20. The power generating circuit according to claim 19, wherein, if one of the first control signal, the second control signal, the third control signal, and the fourth control signal is an on-signal, a power voltage is output from the output terminal.

21. The power generating circuit according to claim 19, wherein, only if one of the first control signal, the second control signal, the third control signal, and the fourth control signal is an on-signal, a power voltage is output from the output terminal, and if the first control signal, the second control signal, the third control signal, and the fourth control signal are off-signals, a 0 voltage is output from the output terminal.

22. The power generating circuit according to claim 19, wherein the first transistor to the sixteenth transistor are P-type or N-type MOS transistors.

23. A switching circuit, comprising:
a power generating circuit according to any one of claims 1 to 22;
a switch unit which is switched on/off according to a control signal; and
a power amplifier that receives the control signal.

24. The switching circuit according to claim 23, further comprising a power source unit which supplies power to the power amplifier.

25. The switching circuit according to claim 23, further comprising a power source unit which supplies power to the power amplifier, wherein the switch unit is supplied with power generated in the power generating circuit.

\* \* \* \* \*